US006777972B2

United States Patent
Roussel et al.

(10) Patent No.: US 6,777,972 B2
(45) Date of Patent: Aug. 17, 2004

(54) METHOD AND APPARATUS FOR DETECTING BREAKDOWN IN ULTRA THIN DIELECTRIC LAYERS (75) Inventors: Philippe Roussel, Linden-Lubbeek (BE); Robin Degraeve, Ghent (BE); Geert Van den Bosch, Leuven (BE)

(73) Assignee: Interuniversitair Microelektronica Centrum (IMEC, vzw), Leuven (BE)

(*) Notice: Subject to any disclaimer, the term of this patent is extended or adjusted under 35 U.S.C. 154(b) by 91 days.

(21) Appl. No.: 10/127,381

(22) Filed: Apr. 22, 2002

(65) Prior Publication Data

US 2003/0016046 A1 Jan. 23, 2003

Related U.S. Application Data (60) Provisional application No. 60/287,028, filed on Apr. 27, 2001.

(51) Int. Cl.$^7$ .............................................. G01R 31/26
(52) U.S. Cl. ...................................... 324/766; 324/765
(58) Field of Search ............................... 324/765, 766, 324/613; 257/48; 438/14; 702/35

(56) References Cited

U.S. PATENT DOCUMENTS 6,255,841 B1 * 7/2001 Lebo et al. ................. 324/765
6,563,323 B2 * 5/2003 Inoshita et al. ............. 324/523

OTHER PUBLICATIONS

G.B. Alers et al., "Trap Assisted Tunneling as a Mechanism of Degradaton and Noise in 2–5 nm Oxides," *IRPS Proc.*, pp. 76–79 1998.

S. Baase, *Computer Algorithms*, New York: Addison–Wesley, 1988, ch. 2, pp. 47–52.

F. Crupi et al., "On the properties of the gate and substrate current after softbreakdown in ultrathin oxide layers," *IEEE Trans. Elec. Dev.*, vol. 45, No. 11, pp. 2329–2334, 1998.

M. Depas et al., "Soft breakdown of ultra–thin gate oxide layers," *IEEE Trans. Elec. Dev.*, vol. 43, No. 9, pp. 1499–1504, 1996.

B. Weir et al., "Ultra–Thin Gate Dielectrics: They Break Down, But Do They Fail?" *IEDM Tech. Dig.*, pp. 73–76, 1997.

E. Wu et al., "Structural Dependence of Dielectric Breakdown in Ultra–Thin Gate Oxides and Its Relationship to Soft Breakdown Modes and Device Failure," *IEDM Tech. Dig.*, pp. 187–190, 1998.

* cited by examiner

*Primary Examiner*—Kamand Cuneo
*Assistant Examiner*—Paresh Patel
(74) *Attorney, Agent, or Firm*—McDonnell Boehnen Hulbert & Berghoff LLP (57) ABSTRACT

A method for detecting breakdown in a dielectric layer. The method includes applying a signal to the dielectric layer, measuring a plurality of sets of readings having values, which are in relation to the signal, searching and identifying outlier readings in each of the sets, the outlier readings being defined by the fact that they have values which are significantly higher or lower than the majority of the values of the set, selecting from each of the sets, one reading which is not one of the outlier readings, and comparing the value of the one selected reading to a reference value, so that the exceeding of the value leads to the conclusion that a predefined probability is present for having a breakdown state in the layer.

12 Claims, 7 Drawing Sheets

FIG. 12

METHOD AND APPARATUS FOR DETECTING BREAKDOWN IN ULTRA THIN DIELECTRIC LAYERS

REFERENCE TO RELATED APPLICATION

This application claims priority benefits to U.S. provisional application Ser. No. 60/287,028, filed on Apr. 27, 2001, entitled "Accurate and Robust Noise-Based Trigger Algorithm for Soft Breakdown Detection in Ultra Thin Oxides." This application incorporates by reference U.S. provisional application Ser. No. 60/287,028 in its entirety.

FIELD OF THE INVENTION

Oxide breakdown is one of the most threatening failure mechanisms in integrated circuits. As the oxide thickness is decreased in the sub-5 nm range, the breakdown definition itself is no longer clear and its detection becomes problematic. The present invention is related to methods of detecting the breakdown in dielectric layers, in particular oxide layers of such low thickness.

STATE OF THE ART

The following documents belonging to the state of the art are referred to in this section:

[1] M. Depas, T. Nigam et al., "Soft breakdown of ultra-thin gate oxide layers," *IEEE Trans. Elec. Dev.*, vol. 43, no. 9, pp. 1499-1504, 1996.
[2] E. Y. Wu et al., "Structural Dependence of Dielectric Breakdown in Ultra-Thin Gate Oxides and Its Relationship to Soft Breakdown Modes and Device Failure," *IEDM Tech. Dig.*, pp. 187-190, 1998.
[3] F. Crupi, R. Degraeve et al., "On the properties of the gate and substrate current after softbreakdown in ultrathin oxide layers," *IEEE Trans. Elec. Dev.*, vol. 45, no. 11, pp. 2329-34, 1998.
[4] B. Weir et al., "Ultra-Thin Gate Dielectrics: They Break Down, but do they Fail?" *IEDM Tech. Dig.*, pp. 73-76, 1997.
[5] G. B. Alers et al., "Trap Assisted Tunneling as a Mechanism of Degradaton and Noise in 2-5 nm Oxides," *IRPS Proc.*, pp.76-79, 1998. G. B. Alers, B. E. Weir, M. A. Alam, G. L. Timp, and T. Sorch, Lucent Technologies, Murray Hill, N.J.
[6] S. Baase, *Computer Algorithms*, New York: Addison-Wesley, 1988, ch. 2, pp. 47-52.

All references in the text below which contain square brackets [] refer to one or more of these six documents.

An accurate determination of the gate oxide reliability is of great importance for the correct prediction of IC lifetime. In the past, the accuracy of this prediction was mainly limited by the accuracy of the extrapolation from high voltage time-to-breakdown ($t_{BD}$) data to low voltage. Apart from the distinction between intrinsic and extrinsic breakdown, the intrinsic mode can be 'soft' or 'hard' [1]. Since the identification of soft and hard breakdown modes (SBD and HBD, respectively), the definitions of oxide breakdown and oxide failure are no longer obvious. Defining soft breakdown (SBD) and hard breakdown (HBD) precisely turns out to be a difficult task. SBD is usually associated with a smaller current jump during a Constant Voltage Stress (CVS) or a smaller voltage drop during Constant Current Stress (CCS) compared to the HBD case. As confirmed by some research groups, the soft and hard breakdowns are caused by the same physical mechanism: SBD is considered to be a breakdown without the thermal runaway effects that lead to a low-resistance breakdown path connecting gate and substrate [1]. Based on this assumption and the observation that hard breakdown is dominant in small geometry transistors [2], we consider the time-to-first breakdown, regardless of whether it is soft or hard, as time-to-breakdown in this description.

This leaves the problem of correctly determining the time-to-soft breakdown. SBD occurs when the generated density of traps during a CVS or CCS has sufficiently increased to generate (at some random place on the capacitor area) a breakdown path of traps connecting anode with cathode. SBD is (just as HBD) a local event. As a consequence the Ig-Vg characteristic of the SBD is, apart from some statistical fluctuations, independent of the test area [3]. This IV-curve is the most unambiguous signature of an SBD event, and measuring it is therefore the most direct way to detect SBD. However, this approach has the disadvantage that the stress needs to be interrupted at regular time intervals to measure the low voltage current. This is time-consuming and might influence the time-to-breakdown, especially when the current or voltage overshoot at the start of each stress interval is not well-controlled.

A better method is to determine the breakdown event real-time by monitoring the most adequate parameter. In [4,5], it has been observed that SBD is accompanied by a gate current noise increase. This increase has been used as a trigger for SBD detection [5].

However, simple noise monitors like the variance of current values during constant voltage stress are too sensitive to pre-BD events and spikes, resulting in false BD triggers.

AIM OF THE INVENTION

The present invention aims to provide an accurate method for detecting soft breakdown events in integrated circuit devices, wherein a reduced sensitivity is present to pre-breakdown events, resulting in a lower probability of erroneous breakdown detection.

SUMMARY OF THE INVENTION

The present invention is related to a method for detecting breakdown in a dielectric layer, comprising the steps of:
- applying a signal to said dielectric layer,
- measuring a plurality of sets of readings having values, which are in relation to said signal,
- searching and identifying outlier readings in each of said sets, said outlier readings being defined by the fact that they have values which are significantly higher or lower than the majority of the values of said set,
- selecting from each of said sets, one reading which is not one of said outlier readings,
- comparing the value of said one selected reading to a reference value, so that the exceeding of said value leads to the conclusion that a predefined probability is present for having a breakdown state in said layer.

According to the preferred embodiment, the value of said one selected reading is the median ($m_r$) of the values of said set of readings.

Preferably, for each set of readings, a second set of readings is measured, said second set consisting of at least twice the amount of readings of said first set of readings, and wherein said reference value is a function of the value of a selected reading of said second set, said selected reading being selected in the same way as said selected reading of said first set.

According to the preferred embodiment, the value of said selected reading of said second set is the median ($m_{ref}$) of the values of said second set of readings.

Preferably, said function is a linear function $f(m_{ref})=am_{ref}$, with a predefined factor 'a'.

In the method of the invention, the sorting of said sets of readings is preferably done according to an indirect insertion sorting technique.

According to a first embodiment, said signal is a voltage signal, corresponding to a voltage difference across said layer, and said readings are absolute values of the change of the current flowing through said layer, as a consequence of said voltage signal, said change being calculated on the basis of a set of current readings, as the difference between two subsequent current readings of said set.

According to a second embodiment, said signal is a current signal, corresponding to a current flowing through said layer, and said readings are absolute values of the change of the voltage across said layer, as a consequence of said current signal, said change being calculated on the basis of a set of voltage readings, as the difference between two subsequent voltage readings of said set.

The invention is also related to an apparatus for detecting breakdown in a dielectric layer, said apparatus comprising means for applying a test signal to a dielectric layer, means for measuring a number of sets of readings, means for searching and selecting one reading in each set, means for comparing the value of said one selected reading to a reference value, output means for indicating that a breakdown state is present in said layer, with a given probability, on the basis of said comparison.

According to the preferred embodiment, said means for calculating comprises means for sorting said sets of readings according to an indirect insertion sorting technique.

In an apparatus of the invention, said test signal may be a voltage signal, corresponding to a voltage difference across said layer, in which case said readings are absolute values of current changes.

Alternatively, said test signal may be a current signal, corresponding to a current through said layer, in which case said readings are absolute values of voltage changes.

BRIEF DESCRIPTION OF THE DRAWINGS

FIGS. 4A-C illustrate the capability of different noise estimators to avoid false breakdown detection.

FIGS. 5A-C illustrates the capability of the method of the invention to detect an actual breakdown event.

FIGS. 6A-C illustrates the detection of breakdown with the help of a running reference value for the noise estimator.

DETAILED DESCRIPTION OF THE INVENTION

The present invention is related to a new optimized trigger method and apparatus for SBD based on gate current noise increase that is sufficiently reliable to be applied for real-time, automatic breakdown (BD) detection. Automated BD tests often stress the devices until HBD occurs. The method according to one aspect of the invention even allows interruption of the CVS upon detection of SBD, resulting in considerably shorter overall test times.

In the next section, the need for a reliable SBD detection algorithm for automatic CVS measurements on ultra thin oxides is demonstrated. Then, the new noise-based SBD detection algorithm of the invention is presented, with specific attention for some real-time implementation issues. Next, the sensitivity of the algorithm as a function of its input parameters is studied. Finally, the influence of capacitor area, stress voltage, Random Telegraph Signal-like (RTS) pre-BD events, early breakdowns and the measurement hardware are discussed.

The following description will focus on NMOS transistors with small dimensions, stressed in inversion, because this condition mimics the real situation in circuits, and because the high voltage stressing of very thin oxides becomes inaccurate in large area devices due to parasitic series resistance. However, the present invention is not restricted to NMOS transistors. The description further focuses on gate current measurement during CVS. Moreover, the method of the invention applies also to voltage measurements during CCS. It will suffice to replace every reference to current values Ig or relative current values $\Delta I$ in the following description by analogue voltage values Vg and $\Delta V$.

Figure 1:
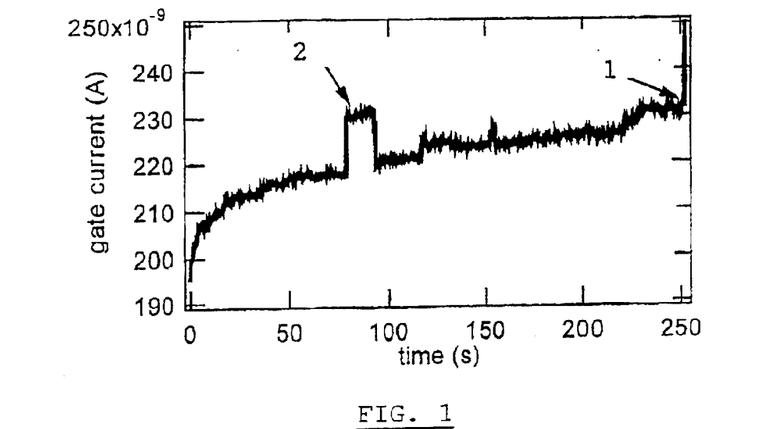
FIG. 1 illustrates the gate current of an NMOS transistor as a function of time, until breakdown occurs.
Figure 2:
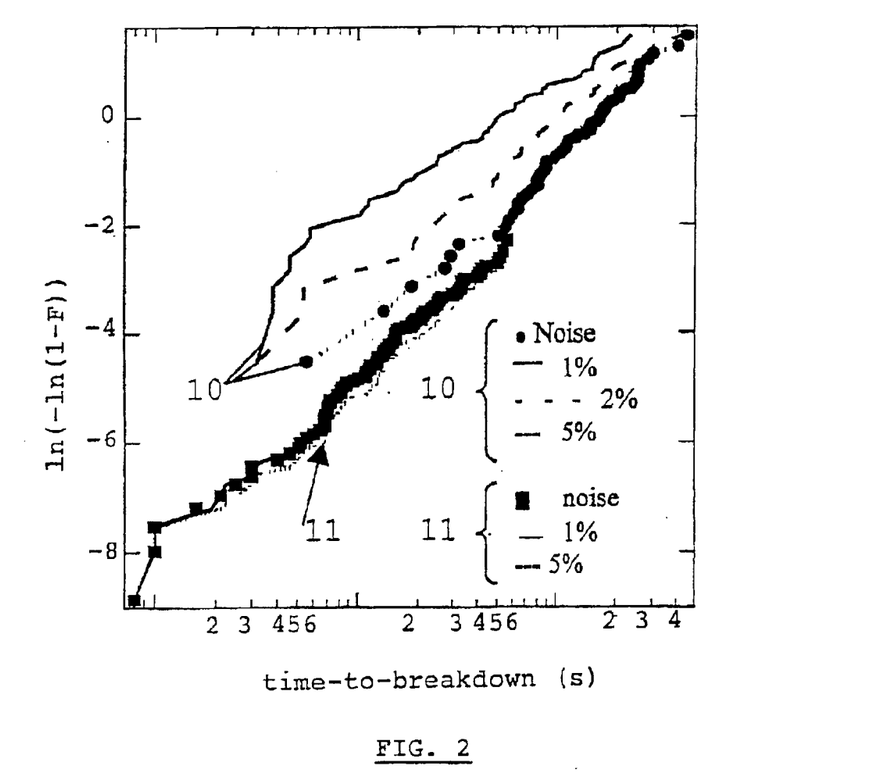
FIG. 2 represents Weibull distributions of time-to-breakdown (in seconds) for a small and large device, for different trigger methodologies.

FIG. 1 shows the current vs. time behavior until breakdown (shown as element 1 in FIG. 1) for an NMOS transistor of dimensions (length×width) $0.2\times10\ \mu m^2$, stressed under Vg=4.4V. The current vs. time behavior in small dimension transistors during a Constant Voltage Stress shows RTS-like events 2 as illustrated in FIG. 1. These gate current jumps are not breakdowns, but pre-breakdown events because the $t_{BD}$-distributions obtained on two different areas by triggering on these jumps do not line up after the well-known area scaling law has been applied. FIG. 2 shows the Weibull plot of the area scaled $t_{BD}$-distribution (scaled to $2\times10^{-8}\ cm^2$–oxide thickness=2.4 nm), measured by triggering on noise increase, or by triggering on a gate current step of 1, 2 or 5 percent, in the case of a small area of $2\times10^{-8}\ cm^2$ (group of curves 10) and in the case of a larger area of $2\times10^{-6}\ cm^2$ (group of curves 11).

In small area devices, a 5 percent step trigger is needed to approximate the noise-triggered distribution. Only the noise-triggered distributions line up for both areas, proving that the gate current steps observed in small area devices are not breakdowns, but pre-breakdown events.

Figure 3:
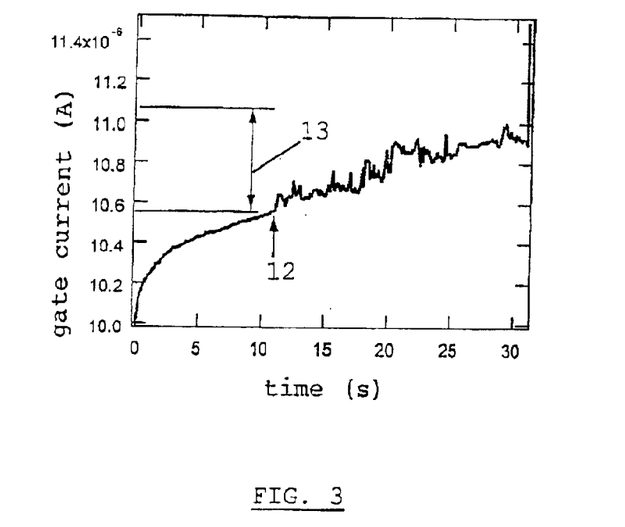
FIG. 3 is a graph of the time versus gate current, illustrating the relation between the detection level and the current increase upon breakdown.

It should be noted that when pre-BD is mistaken for real breakdown, a flatter $t_{BD}$-distribution is obtained which will lead to erroneous prediction of the oxide reliability. Also, after each pre-BD gate current step no significant noise increase is measured which confirms that noise is a well-suited monitor for detecting soft breakdown. Only when the detection sensitivity for current steps is lowered, triggering on pre-BD events in small devices is avoided, but applying the same sensitivity to larger areas leads to several SBD's being overlooked. This is illustrated in FIG. 3, which is relative to an NMOS transistor of size (length×width) 1×100 $\mu m^2$, stressed at Vg=4.4V. At point 12, SBD occurs, which would not be detected by a 5% step trigger 13.

The simplest approach to applying noise for breakdown detection is monitoring the sample standard deviation of a number of gate current values, preferably in a subset containing a fixed number $n_r$ of consecutive current measurements including the last measured value. The set should be chosen sufficiently large to generate statistically relevant parameters, but it should still be sufficiently small to allow for an acceptable time resolution. The 'running' estimate s' for the standard deviation $\sigma$ will increase when the gate current noise increases at breakdown.

It is also possible to consider a set with $n_r$ absolute values of consecutive current changes $\Delta I$, wherein $\Delta I=|I_n-I_{n-1}|$. The mean moving range E(r) is the average of this $\Delta$ set and also represents a simple monitor for the noise on the current signal. It can be mathematically proven that the predicted value of this running mean E(r) is proportional to the $\sigma$ of the currents for normally distributed current fluctuations. Mathematical proof of this is given in Appendix 1.

Figure 4:
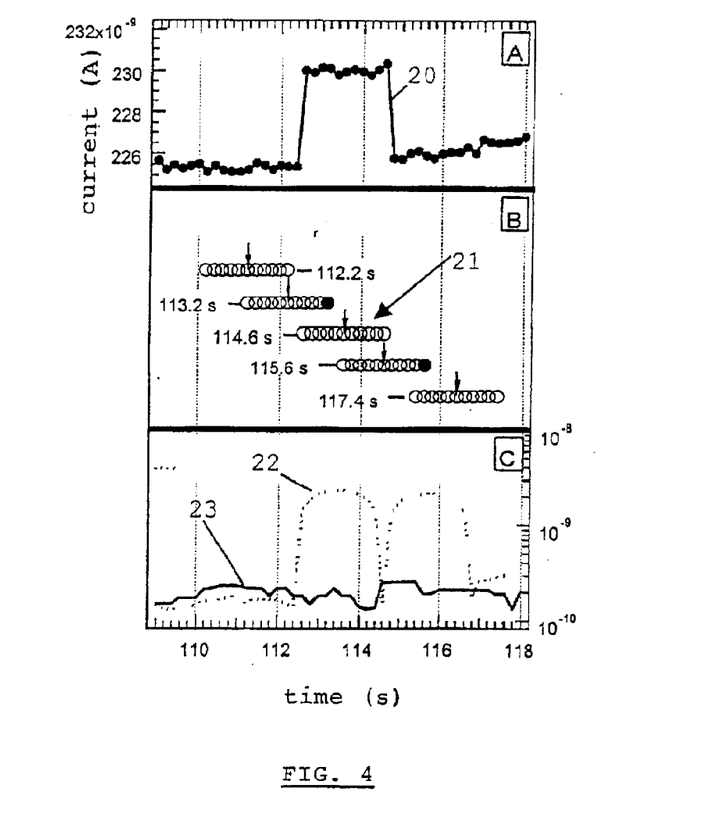
FIG. 4A is a graph of the time versus the gate current.
FIG. 4B is a graph of time versus the change in current ($\Delta I$).
FIG. 4C is a graph of the time versus the standard deviation.

Both monitors defined above have one major disadvantage. They are sensitive to current steps (such as pre-BD events) and current spikes (caused by accidental measurement errors), resulting in false triggers: a large outlier $\Delta$ will heavily influence the sum of $\Delta$ values used for computation of the mean moving range E(r), while a single outlier current in the subset will even completely dominate the sum of squares for the computation of s'. An outlier is an extreme value that is not related to the process for monitoring. FIG. 4 illustrates this problem. The figure shows an NMOS transistor of 0.2×10 $\mu m^2$, stressed at Vg=4.4V. FIG. 4A shows a gate current jump 20 as a function of time, which is not related to a breakdown phenomenon, and should not be detected as such by the noise-based algorithm. FIG. 4B illustrates a series of sets 21 of 11 measured $\Delta I$-values ranked from low to high, each $\Delta I$-value based on the measurement of $n_r$=12 gate current (Ig) values. Open circles correspond to $\Delta I$-values below $10^{-9}$ A; black circles correspond to $\Delta I$-values above $10^{-9}$ A. Each set containing one slope of the current jump therefore comprises one black circle. If the running standard deviation s' is to be used (based on the current values Ig themselves, not the $\Delta I$-values), the result, as a function of time, is visible in FIG. 4C, see the dotted lines 22. It is clear that the running standard deviation s' increases by a factor 10 due to this current jump, which would result in a false trigger.

One aspect of the present invention solves this problem in a well-designed way by selecting a value of the $\Delta$ set which is not an outlier value, as the breakdown monitor. An outlier value can then be defined as a value which is significantly higher or lower than the majority of values in the set. Preferably, outlier values are identified by the fact that they exceed a predefined border value, such $10^{-9}$ A in the example above.

According to one preferred embodiment, the selected value is the median $m_r$ of the $\Delta$ set. For an odd number of values, finding the median of a dataset consists of sorting the data and taking the middle value as the central value estimator, see the vertical arrows above each set of $\Delta I$-values. For an even number of values, the average of the middle two values is taken. This complication can be avoided by requiring an odd number of $\Delta$ values. The effect is illustrated in FIG. 4C, curve 23, which shows the evolution of $m_r$ as a function of time. $m_r$ is not increased by the gate current peak, which introduces only one high $\Delta I$-value in the set, which in turn does not affect the runnng median $m_r$.

Figure 5:
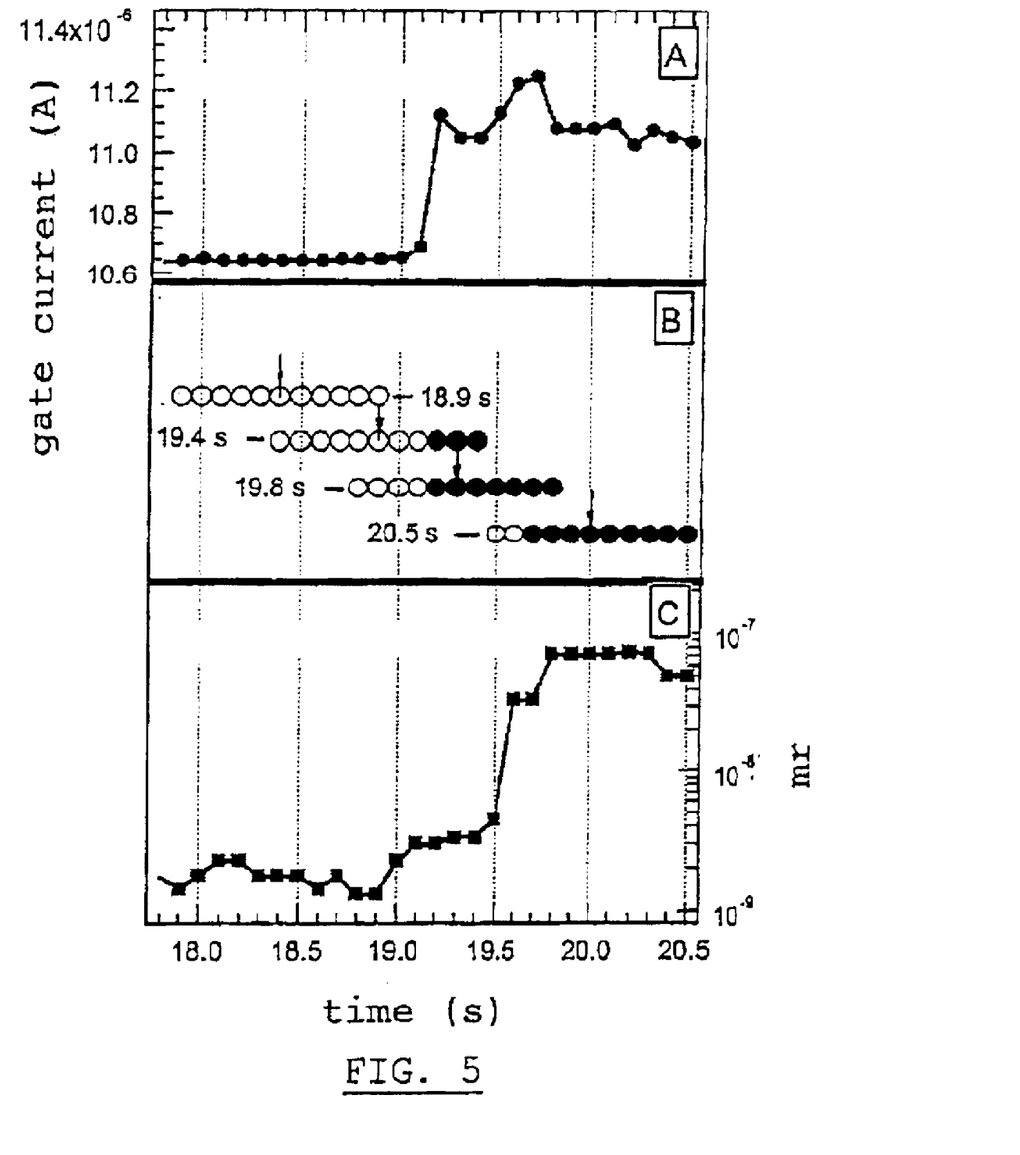
FIG. 5A is a graph of time versus gate current.
FIG. 5B is a graph of time versus the change in current ($\Delta I$).
FIG. 5C is a graph showing the running median $m_r$, as a function of time.

The predicted value of this running median $m_r$ is also proportional to the $\sigma$ of the currents for normally distributed current fluctuations, but the proportionality factor is different (proof equally given in Appendix 1) due to the skewness of the range distribution. In FIG. 5, it is illustrated why the median will trigger correctly in the case of soft breakdown. FIG. 5 is relative to an NMOS transistor or 1×100 $\mu m^2$, stressed at Vg=4.4V. FIG. 5A shows the gate current increase due to SBD. FIG. 5B shows consecutive sets of $\Delta I$-values, while FIG. 5C shows the running median $m_r$, as a function of time. Effectively, $m_r$ increases when SBD occurs. On the basis of FIGS. 4 and 5, one can conclude that the 'running median' triggers correctly on soft breakdown, but is insensitive to single current jumps and spikes, as large outlier $\Delta$ values are sorted to the upper end of the range statistic. For this reason, $m_r$ is called a robust estimator of $\sigma$.

Figure 6:
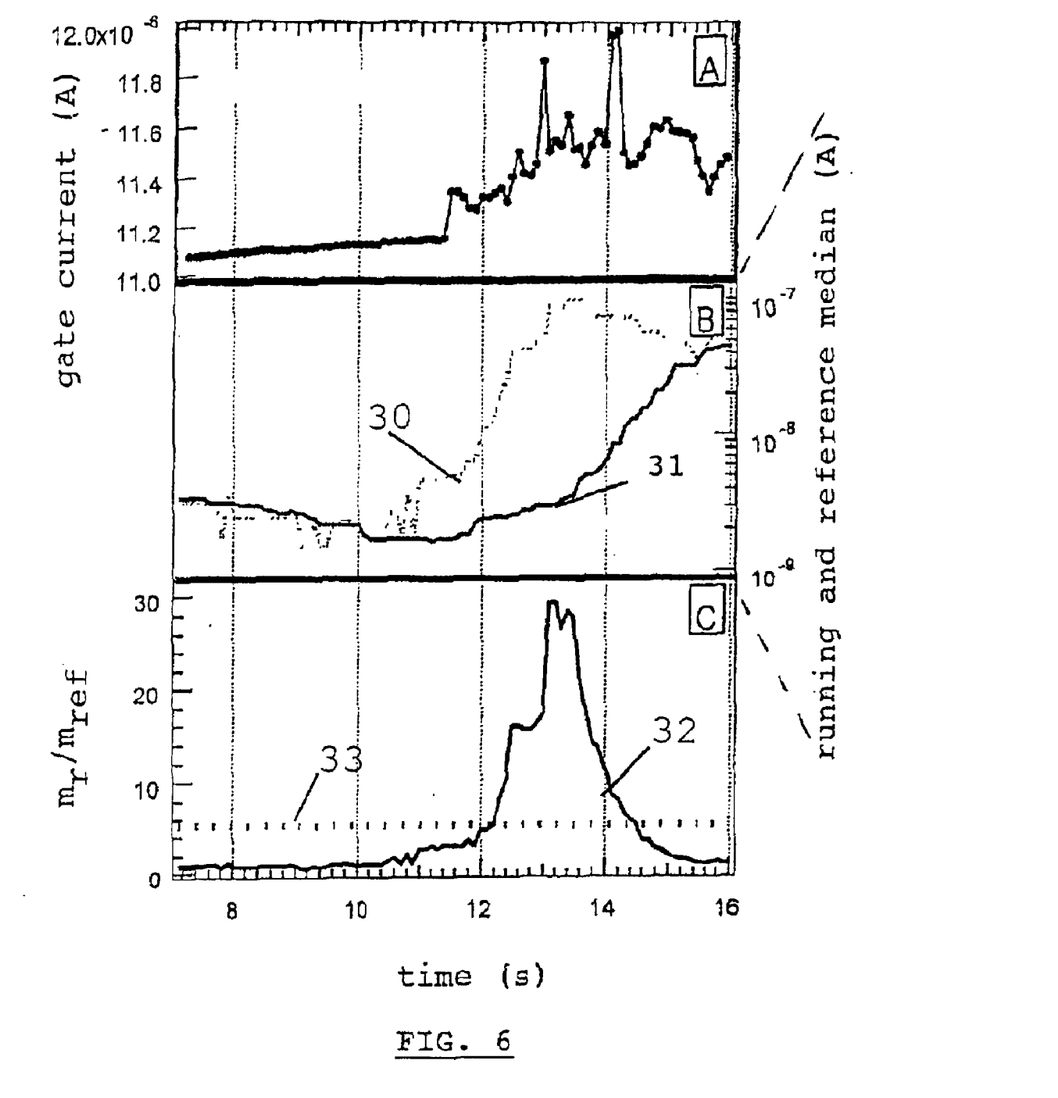
FIG. 6A is a graph of time versus gate current.
FIG. 6B is a graph of time versus running and reference median.
FIG. 6C is a graph of time versus $m_r/m_{ref}$.

With this breakdown monitor established, an obvious detection method would look for steps of $m_r$ as a function of stress time. However, the noise increase is not always very abrupt, as illustrated in FIG. 6. A point-by-point triggering algorithm is unable to detect the jump in $m_r$. To solve this, either an absolute noise trigger can be introduced, or more complicated step-detecting algorithms involving several $m_r$-values can be used. The first solution is not preferred since the absolute trigger level will depend on the oxide area and thickness, the oxide processing and the system noise. The second solution can result in very complicated triggering algorithms that need careful optimization.

According to one aspect of the present invention, a different approach is followed. Along with the running non-outlier value, preferably the median $m_r$, a running reference value is constructed. The running reference is constructed in an identical way as $m_r$, but it is based on $n_{ref}$ current values, with $n_{ref} > 2 \cdot n_r$. A second set of $n_{ref}-1$ current changes is calculated on the basis of the $n_{ref}$ current values, and the running reference is selected as a non-outlier value of said second set. According to one preferred embodiment, the running reference is the median $m_{ref}$ of said second set. Breakdown is triggered when a significant difference between $m_{ref}$ and $m_r$ is detected, or equivalently, when the ratio $m_r/m_{ref}$ exceeds a given value 'a'. In one aspect, the median $m_r$ is compared to a reference value which is preferably a linear function $a.m_{ref}$ of the reference median $m_{ref}$. When $m_r$ exceeds the reference value, breakdown is detected with a predefined probability. Statistically, this can be done with a one-sided F-ratio test on $\sigma_r^2/\sigma_{ref}^2$ or equivalently, $m_r^2/m_{ref}^2$ with $(n_r-1,n_{ref}-1)$ degrees of freedom. For chosen values of $n_r$, $n_{ref}$, $m_r/m_{ref}$-ratio and significance level, this test simply reduces to finding when the square root of the F-ratio exceeds a fixed detection threshold which can be calculated before the stress measurement starts. According to one aspect of the invention, a default 99.73% value for the significance probability is preferably chosen, as this corresponds with the 3σ limits for a normally distributed signal, which is commonly used for statistical process control purposes. Thus, the real-time detection of breakdown becomes very straightforward, as is illustrated in FIG. 6. This figure is valid for an NMOS transistor of 1×100 $\mu m^2$, stressed at Vg=4.4V. FIG. 6A shows the current increase due to SBD. Curves 30 and 31 represent the $m_r$ and $m_{ref}$ values, as a function of time. The $m_r$-curve 30 shows a rather gradual increase, making it difficult for a simple step detecting algorithm to trigger properly. FIG. 6C shows the evolution of the ratio $m_r/m_{ref}$. This curve 32 rises well above the 5.33 threshold (line 33) corresponding to the event of exceeding $m_r/m_{ref}$=3 with a significance probability of 99.73%.

In practice, the real-time detection method and apparatus should be designed in a computationally efficient way, so that it can keep up with the stream of incoming current values from the measurement hardware. Performing a complete sort of each range subset upon acquisition of a new current value would take a considerable amount of the computation time needed by the algorithm. It is more efficient to perform an indirect insertion sort (see also reference [6]) "on the fly" on an array of moving range values stored in a cyclic way. Indirect sorting reorders an array of indices to the data points instead of the data points themselves. This approach even allows to store only a single array of ($n_{ref}$-1) range values in memory and to perform the indirect insertion sort for both $m_r$ and $m_{ref}$ using 2 arrays of indices to that same Δ subset. The procedure is explained in detail in Appendix 2.

The detection efficiency of the method and apparatus and the influence of its parameters are discussed in the following.

The $m_r/m_{ref}$ ratio detection level (line 33 in FIG. 6) determines the detection efficiency of the algorithm: for Gaussian noise, a higher $m_r/m_{ref}$ ratio lowers the α risk (representing the probability of false early detections) at the expense of a higher β risk (representing the probability of overlooking a true noise increase due to SBD). A proper balance between these two risks should be determined for a given measurement setup by means of a calibration procedure.

Larger $n_r$ and $n_{ref}$ values enhance the distinctive power of the detection method and apparatus. Both the α risk and the β risk are predictably lower for Gaussian noise. By the same token, increasing $n_r$ and $n_{ref}$ also enhances the robustness of the algorithm against "non-Normal" events like spikes, pre-BD steps, and more specifically, longer RTS-like signals, as a larger amount of outlier ranges have to accumulate in the sorted moving range statistic before they reach its middle. However, using larger $n_r$ and $n_{ref}$ values for detection is at the expense of a lower time resolution for the $t_{BD}$ values: as half of the short range sample collection time is taken as the average delay time for detection, longer samples correspond with a larger uncertainty on $t_{BD}$.

Figure 7:
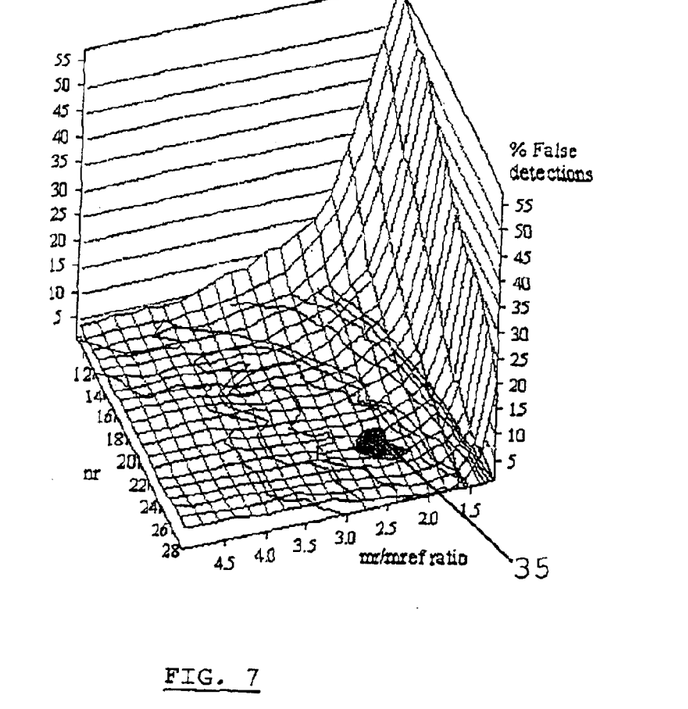
FIG. 7 is a 3-dimensional plot, providing an overview of the influence of several parameters on the accuracy of the detection algorithm.

The 3D surface plot in FIG. 7 shows an experimental verification of the algorithm efficiency as a function of $n_r$ and the $m_r/m_{ref}$-ratio detection level. The $t_{BD}$ times (either SBD or HBD) of a set of NMOS transistors with 2.4 nm gate oxide thickness stressed in inversion at 4.4V were determined through visual inspection of the I(t) curves measured till HBD. Some I(t) curves showing a slow gradual increase of the noise were discarded from the original dataset, as it was too hard to unambiguously pinpoint the SBD time on them. Note that once the SBD detection algorithm according to the invention is tuned properly, it can be used to determine the SBD time for the "problem" I(t) curves as well. The selection process yielded 256 I(t) curves with either a sufficiently clear SBD signature, or none at all (HBD): 94 on L×W=1×100 $\mu m2$, 64 on L×W=0.2×10 $\mu m2$ and 98 on L×W=0.18×10 $\mu m2$ transistors.

The $t_{BD}$ values determined by visual inspection were then used as a reference for validation of the $t_{BD}$ values found by the noise based detection algorithm for $n_r$ values from 11 to 30, $m_r/m_{ref}$-ratio's from 1.2 to 5 in steps of 0.2 and a fixed $n_{ref}$=60 value (twice the larger $n_r$ value). The percentage of false detections ($t_{BD}$ significantly deviating from the reference $t_{BD}$ value) were then plotted as a function of $n_r$ and $m_r/m_{ref}$ (FIG. 7).

Clearly, lower $n_r$ and $m_r/m_{ref}$ values lead to an extremely high percentage of false early SBD detections (above 50%). In this region of the plot, the experimental α risk dominates. On the other hand, higher $n_r$ and $m_r/m_{ref}$ values lead to a relatively high percentage of late detections (above 5%): the experimental β risk dominates in that region of the plot. Thus, the surface shows a diagonal valley of reliable detection, with an overall optimum of 3/256 near $n_r$=24 & $m_r/m_{ref}$=2.4 (region 35). It should be noted however, that the verification was performed using a dataset acquired on relatively small gate areas.

In the following paragraphs, the applicability range of the method and apparatus as a function of capacitor area and stress voltage, specific problems like the detection of early breakdowns and the sensitivity to RTS signals, and some hardware limitations are considered.

Figure 8:
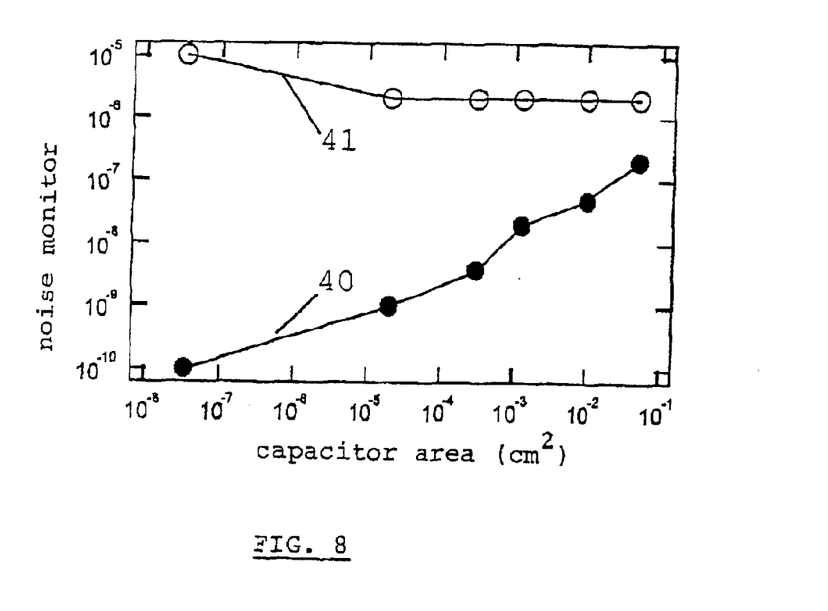
FIG. 8 is a graph of capacitor area versus noise monitor, showing the relation between the detection capabilities of the method of invention, and the capacitor area involved.
Figure 9:
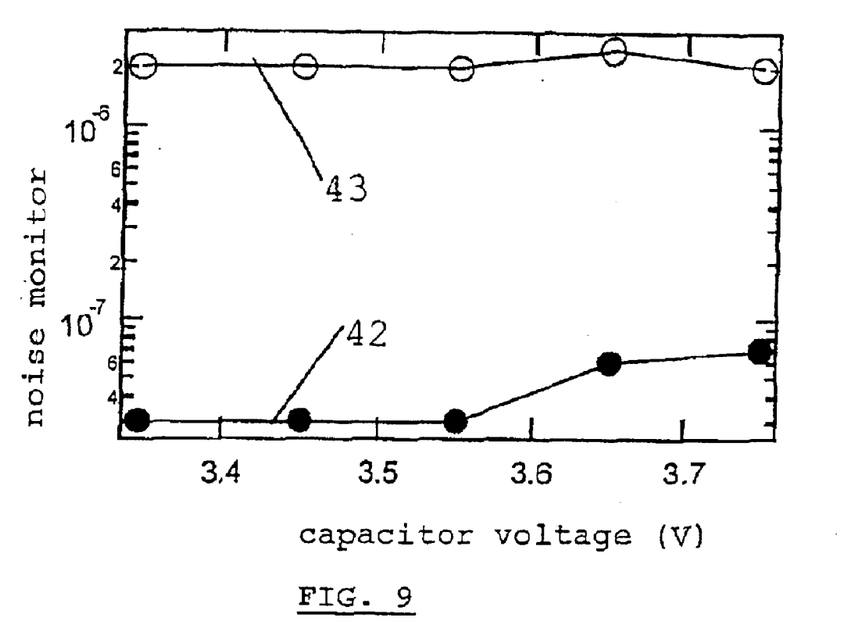
FIG. 9 is a graph of capacitor area versus noise monitor, showing the same relation as FIG. 8, but for small devices only.

In FIG. 8, the value of the local noise estimator $m_r$ before (curve 40) and after breakdown (curve 41) is plotted for capacitors with different areas. It is to be noted that the data for FIGS. 8 & 9 are from capacitors stressed in accumulation. Oxide thickness was fixed at 2.4 nm, except for the smallest area where a capacitor with 2.2 nm oxide thickness was used (all values are optical thicknesses). It is clear that the detection margin closes for large area capacitors as the pre-breakdown gate current noise level increases steadily, but even for an area of 5 $mm^2$, the noise before and after breakdown differs by 1 order of magnitude, which is sufficient for a reliable detection. The post-breakdown noise is relatively independent of the area, meaning that this noise is indeed a signature of the localized soft breakdown spot.

One can speculate that the noise monitor of the invention will be unable to detect breakdown for very large capacitor areas. This is, however, irrelevant since for this thickness, measurements on capacitors larger than 5 $mm^2$ become impossible because of the non-uniformity of the stress caused by series resistance of the polysilicon gate. Larger optimal values for $n_r$, $m_r/m_{ref}$ and $n_{ref}$ than those found during the verification of the method will probably be necessary to enhance the distinctive power of the method for reliable SBD detection on larger areas. FIG. 9 shows the detection margin for a 1 $mm^2$ capacitor as a function of the stress voltage. There is no apparent dependence of both the pre- and the post-breakdown noise levels (curves 42 and 43) on stress voltage, implying that noise can be used at any stress voltage in the typical high voltage test range.

In practice it is possible that a breakdown (either soft or hard) occurs before ($n_{ref}$-1) Δ values have been acquired, so that no proper $m_{ref}$ value is available yet. The algorithm can be protected against this by requiring an extra user-specified $\sigma_{ref}$ input. Note that $m_r$ has to be converted into the corresponding $\sigma_r$ estimator (see Appendix 1) to test a proper $\sigma_r/\sigma_{ref}$ ratio as long as $m_{ref}$ is not available.

Figure 10:
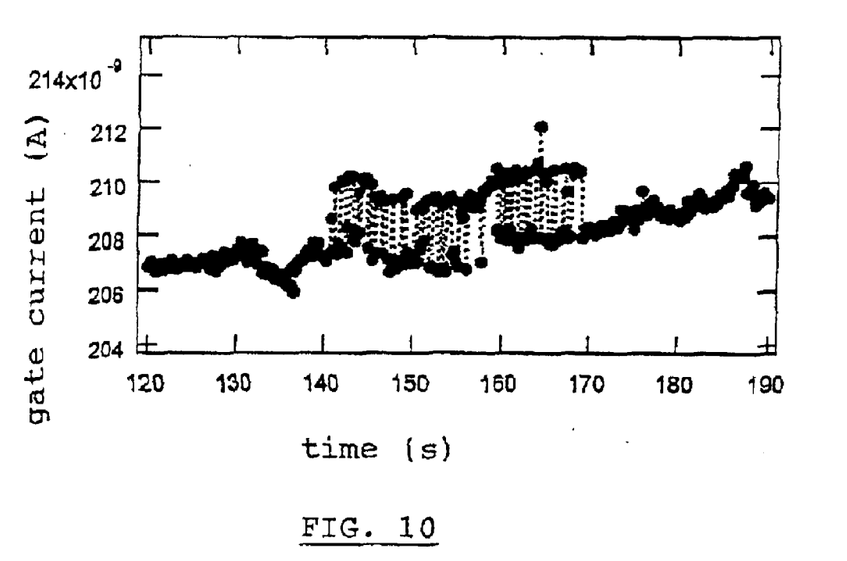
FIG. 10 is a graph of time versus gate current, illustrating problems that may arise in the case of long RTS-like signals.

Fast and sufficiently long RTS signals like the one shown in FIG. 10 can be misinterpreted by the algorithm as a noise increase and trigger faulty detection. Depending on the $n_r$ setting, the sorted range statistic will fill up from right to left with the larger range values and trigger detection when its middle is reached. This can be countered by larger $n_r$ and $n_{ref}$ settings at the expense of time resolution.

Obviously, the background noise of the measurement system must be smaller than the signature noise attributed to SBD. Moreover, the resolution of the current meter must be such that it is capable of measuring the noise before breakdown. Digital current meters return quantised current levels when the true current fluctuations are close to their resolution limit, resulting in occasional zero $m_{ref}$ values. The algorithm can be protected against this by replacing any of the corresponding zero $\sigma_{ref}$ values with the user-specified $\sigma_{ref}$ value, if occurring.

As the system has to be protected against the short currents that can occur at HBD, the voltage source compliance setting can be used as a separate trigger for HBD. Moreover, some voltage sources return a constant measured current value when in compliance. The noise detection algorithm cannot be used for detection of the HBD event then, so that this separate HBD trigger is even mandatory for such configurations.

Figure 11:
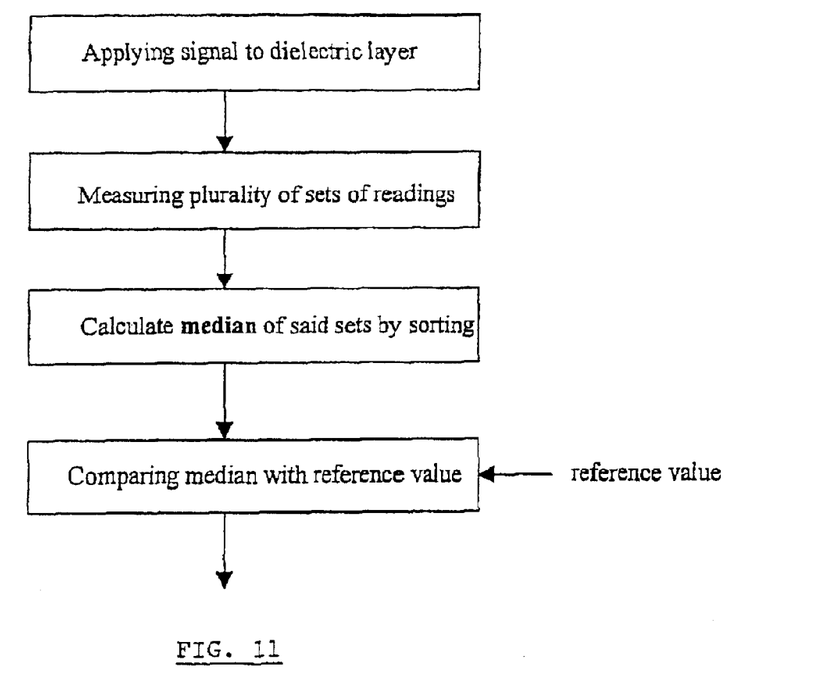
FIG. 11 is a flow chart summarizing the method of the invention in its most general form.
Figure 12:
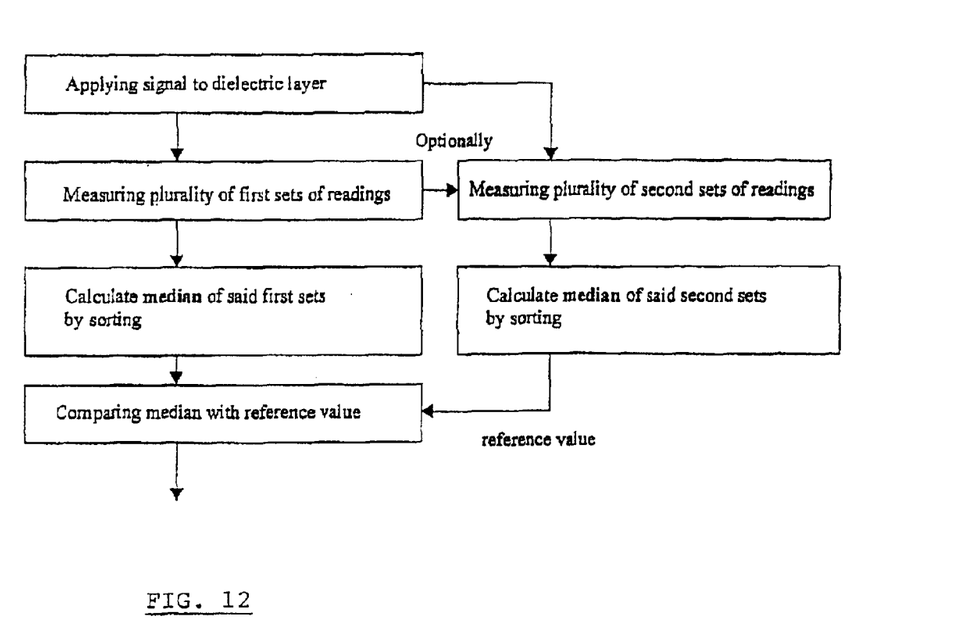
FIG. 12 is a flow chart summarizing the method of the invention making use of a running reference value.

Concluding, the present invention is related to an accurate and robust triggering algorithm for soft breakdown based on gate current noise increase that is sufficiently reliable to be applied for real-time, automatic BD detection, with acceptable execution speed if implemented properly. Triggering on current spikes or pre-BD events is avoided. This test assures correct SBD-detection in a wide range of stress conditions and various geometries. The efficiency of the algorithm and the influence of its parameters have been discussed. The method in its most general form is summarized in the flow chart of FIG. 11. FIG. 12 is a flow chart summarizing the method including the use of a running reference value.

An exemplary embodiment of the present invention has been illustrated and described. It will be understood, however, that changes and modifications may be made to the invention without deviating from the scope of the invention, as defined by the following claims. Further, the claims should not be read as limited to the described order of elements unless stated to that effect. Therefore, all embodiments that come within the scope and spirit of the following claims and equivalents thereto are claimed as the invention.

Appendix 1: The Median Moving Range as a Robust Sigma Estimator

This appendix explains how the concept of a robust $\sigma$ estimator originates from Statistical Process Control (SPC) and derives the relationship between the median moving range and the corresponding sigma predictor for a Normally distributed signal.

The Concept

In a production environment, a process is under control when the variation of a chosen output parameter is within a given required tolerance. The capability of a process is defined as the ratio between this tolerance and the lowest achievable output variation. Statistical process control (SPC) is the method of choice to assess this capability, and to timely detect significant deviations from the target output. In this context, the mean moving range E(r) of a process characteristic signal is often used to predict its short term variation. The historical data used for that purpose often show slow process drifts, so that the historical sample standard deviation s' becomes significantly larger than the true short term random deviation $\sigma$ reflecting the process capability. The mean moving range filters out most of the signal drift, if occurring. Nevertheless, a sufficient amount of historical data is needed to reliably predict the true population $\sigma$ value using a predictor based on the mean moving range. In practice, a sufficiently long process characteristic even shows sudden shifts caused by input parameter adjustments (e.g. to correct for a known drift due to machine wearout). Such shifts show up as outliers in the moving range statistic. The mean moving range is linearly sensitive to outliers, so that a $\sigma$ predictor based on it can become artificially larger and cause an underestimation of the process capability. In the context of the noise-based trigger algorithm, steps and RTS-like signals can also be seen as sudden shifts of the characteristic signal. The median moving range $m_r$ even filters out such outliers, so that a $\sigma$ predictor based on it will be more robust against that type of non-Normality of the signal.

Computation of the Correction Factor for the $\sigma$ Predictors

The proof is based on the properties of a Poisson process. The density function f(x) of the signal is that of the Normal distribution $N(\mu,\sigma,x)$:

$$f(x) = \frac{1}{\sqrt{2\pi} \cdot \sigma} \cdot e^{-\frac{(x-\mu)^2}{2\sigma^2}}$$

Due to the independence of subsequent data points, the distribution of their differences is equivalent to the difference of two Normally distributed stochastic variables with the same spread: $N(0, \sqrt{2}\sigma,x)$. The moving range statistic (with a subgroup size of 2) consists of taking the absolute value of those differences, thus mirroring the left side of the density function to the right. Due to the symmetry of the density function, this simply doubles the part to the right of the vertical axis. Thus, the moving range distribution has the following single-sided density function:

$$f(r) = \begin{cases} 0 & r < 0 \\ \frac{1}{\sqrt{\pi} \cdot 2\sigma} & r = 0 \\ \frac{1}{\sqrt{\pi} \cdot \sigma} \cdot e^{-\frac{r^2}{4\sigma^2}} & r > 0 \end{cases}$$

The mean moving range E(r) obeys the equation $$E(r) = \int_0^\infty r \cdot f(r) \cdot dr = \frac{1}{\sqrt{\pi} \cdot \sigma} \cdot \int_0^\infty r \cdot e^{-\frac{r^2}{4\sigma^2}} \cdot dr$$

$$= \frac{2\sigma}{\sqrt{\pi}} \cdot \int_0^\infty e^{-\left(\frac{r}{2\sigma}\right)^2} \cdot d\left(\frac{r}{2\sigma}\right)^2 = \frac{2\sigma}{\sqrt{\pi}}$$

So, the $\sigma$ estimator based on E(r) is $$\sigma = \frac{\sqrt{\pi}}{2} \cdot E(r) \approx 0.886227 \cdot E(r)$$

The median moving range $m_r$ is defined by the equation $$F(r) = \int_0^{m_r} f(r) \cdot dr = \frac{1}{\sqrt{\pi} \cdot \sigma} \cdot \int_0^{m_r} e^{\frac{r^2}{4\sigma^2}} \cdot dr = 0.5$$

Substitution of the integration variable $$u = \frac{r}{\sqrt{2} \cdot \sigma}$$

leads to $$\frac{1}{\sqrt{2\pi}} \cdot \int_0^{u_{50}} e^{\frac{u^2}{2}} \cdot du = 0.25$$

$$\Rightarrow u_{50} \approx 0.67448975 \Rightarrow m_r \approx 0.95387 \cdot \sigma$$

So, the $\sigma$ estimator based on $m_r$ is $$\sigma \approx 1.048358 \cdot m_r$$

Appendix 2: Efficient Real-time Implementaion Using Indirect Insertion Sorting

This appendix shows how the execution time of the algorithm can be reduced considerably by using indirect insertion sorting for the real-time computation of both median moving range values. This approach even allows to store only a single array of ($n_{ref}$−1) range values in memory and to perform the indirect insertion sort for both $m_r$ and $m_{ref}$ using 2 arrays of indices to that same $\Delta$ subset. The procedure is explained using a step by step example on the following sample I(t) dataset (arbitrary units) with $n_r$=6 and $n_{ref}$=12:

| t | I |
|---|---|
| 1 | 105 |
| 2 | 100 |
| 3 | 102 |
| 4 | 99 |
| 5 | 101 |
| 6 | 100 |
| 7 | 98 |
| 8 | 99 |
| 9 | 100 |
| 10 | 119 |
| 11 | 111 |
| 12 | 99 |
| 13 | 81 |
| 14 | 113 |
| 15 | 88 |
| 16 | 103 |
| 17 | 117 |
| 18 | 103 |

Initially, the array of range values has to be filled, and the corresponding indirect insertion sort can be performed on the index arrays Lng_rng_indx & Sh_rng_indx as each new $\Delta$ value is padded to the end of the array:

| Lng_rng_vec (size 11) | Lng_rng_indx (size 11) | Sh_rng_indx (size 5) |
|---|---|---|
| [5] | [1] | [1] |
| Insertion sort⇒ | [1] | [1] |
| [5, 2] | [1, 2] | [1, 2] |
| Insertion sort⇒ | [2, 1] | [2, 1] |
| [5, 2, 3] | [2, 1, 3] | [2, 1, 3] |
| Insertion sort⇒ | [2, 3, 1] | [2, 3, 1] |
| [5, 2, 3, 2] | [2, 3, 1, 4] | [2, 3, 1, 4] |
| Insertion sort⇒ | [2, 4, 3, 1] | [2, 4, 3, 1] |
| [5, 2, 3, 2, 1] | [2, 4, 3, 1, 5] | [2, 4, 3, 1, 5] |
| Insertion sort⇒ | [5, 2, 4, 3, 1] | [5, 2, 4, 3, 1] |

At this step, the index array Sh_rng_indx is filled. Because the indices are uniquely defined, it is possible to continue as follows:

determine the index $k_{s,rem}$ of the data point to be removed from the sorted range sample (bold in the table above). It can be computed from the running Lng_rng_indx pointer value $k_1$:

$$k_{s,rem} = (k_1 + (n_{ref}-1) - (n_r-1)'1) MOD(n_{ref}-1) + 1$$

For $k_1$=6, $n_{ref}$=12 & $n_r$=6, this results in $k_{s,rem}$=1.
spot the index of the data point to be removed in the index array.
pinch it from the index array.
pad the index of the new data point at the end of the index array.
perform an indirect insertion sort using the index array.

The latter task can be performed using one time saving pass of the bisection algorithm because the other indices are already properly ordered. This is shown for the next 6 steps below.

| | |
|---|---|
| Lng_rng_vec | [5, 2, 3, 2, 1, 2] |
| Lng_rng_indx | [5, 2, 4, 3, 1, 6] |
| Insertion sort⇒ | [5, 2, 4, 6, 3, 1] |
| Sh_rng_indx | [5, 2, 4, 3, 6] |
| Insertion sort⇒ | [5, 2, 4, 6, 3] |
| Lng_rng_vec | [5, 2, 3, 2, 1, 2, 1] |
| Lng_rng_indx | [5, 2, 4, 6, 3, 1, 7] |
| Insertion sort⇒ | [5, 7, 2, 4, 6, 3, 1] |
| Sh_rng_indx | [5, 4, 6, 3, 7] |
| Insertion sort⇒ | [5, 7, 4, 6, 3] |
| Lng_rng_vec | [5, 2, 3, 2, 1, 2, 1, 1] |
| Lng_rng_indx | [5, 7, 2, 4, 6, 3, 1, 8] |
| Insertion sort⇒ | [5, 7, 8, 2, 4, 6, 3, 1] |
| Sh_rng_indx | [5, 7, 4, 6, 8] |
| Insertion sort⇒ | [5, 7, 8, 4, 6] |
| Lng_rng_vec | [5, 2, 3, 2, 1, 2, 1, 1, 19] |
| Lng_rng_indx | [5, 7, 8, 2, 4, 6, 3, 1, 9] |
| Insertion sort⇒ | [5, 7, 8, 2, 4, 6, 3, 1, 9] |
| Sh_rng_indx | [5, 7, 8, 6, 9] |
| Insertion sort⇒ | [5, 7, 8, 6, 9] |
| Lng_rng_vec | [5, 2, 3, 2, 1, 2, 1, 1, 19, 8] |
| Lng_rng_indx | [5, 7, 8, 2, 4, 6, 3, 1, 9, 10] |
| Insertion sort⇒ | [5, 7, 8, 2, 4, 6, 3, 1, 10, 9] |
| Sh_rng_indx | [7, 8, 6, 9, 10] |
| Insertion sort⇒ | [7, 8, 6, 10, 9] |
| Lng_rng_vec | [5, 2, 3, 2, 1, 2, 1, 1, 19, 8, 12] |
| Lng_rng_indx | [5, 7, 8, 2, 4, 6, 3, 1, 10, 9, 11] |
| Insertion sort⇒ | [5, 7, 8, 2, 4, 6, 3, 1, 10, 11, 9] |
| Sh_rng_indx | [7, 8, 10, 9, 11] |
| Insertion sort⇒ | [7, 8, 10, 11, 9] |

Notice how the index 9 of the first large range value 19 stays at the upper end of both Lng_rng_indx & Sh_rng_indx.
At this step, the index array Lng_rng_indx is filled. The index $k_{1,rem}$ of the data point to be removed from that sorted range sample (bold in the table above) can be computed from the running range counter value $k_\Delta=12$:

$$k_{1,rem}=(k_\Delta-1)MOD(n_{ref}-1)+1$$

From that step on, the corresponding range values in Lng_rng_vec also have to be replaced with the new range values:

| | |
|---|---|
| Lng_rng_vec | [18, 2, 3, 2, 1, 2, 1, 1, 19, 8, 12] |
| Lng_rng_indx | [5, 7, 8, 2, 4, 6, 3, 10, 11, 9, 1] |
| Insertion sort⇒ | [5, 7, 8, 2, 4, 6, 3, 10, 11, 1, 9] |
| Sh_rng_indx | [8, 10, 11, 9, 1] |
| Insertion sort⇒ | [8, 10, 11, 1, 9] |
| Lng_rng_vec | [18, 32, 3, 2, 1, 2, 1, 1, 19, 8, 12] |
| Lng_rng_indx | [5, 7, 8, 4, 6, 3, 10, 11, 1, 9, 2] |
| Insertion sort⇒ | [5, 7, 8, 4, 6, 3, 10, 11, 1, 9, 2] |
| Sh_rng_indx | [10, 11, 1, 9, 2] |
| Insertion sort⇒ | [10, 11, 1, 9, 2] |

At this step, the median moving range ratio could lead to detection, and subsequent exit of the algorithm:

$$\frac{\text{Lng\_rng\_vec[Sh\_rng\_indx[3]]}}{\text{Lng\_rng\_vec[Lng\_rng\_indx[6]]}} = \frac{18}{3}$$

What is claimed is:

1. A method for detecting breakdown in a dielectric layer of a single electronic device, said method comprising the steps of:

applying a signal to said dielectric layer;

measuring a first set of readings having values, said values being in relation to said signal;

searching and identifying outlier readings in said first set of readings, said outlier readings being defined by the fact that they have values which are statistically significantly higher or lower than the majority of the values of said first set of readings;

selecting from said first set of readings a first selected reading that is not one of said out her readings; and comparing the value of said first selected reading to a reference value, such that said first selected reading exceeding said reference value leads to a conclusion that a predefined probability exists for having a breakdown state occur in said dielectric layer.

2. The method of claim 1, wherein said first selected reading comprises a median ($m_r$) of said first set of readings.

3. The method of claim 1, wherein a second set of readings having values is measured for layer, said second set of readings comprising at least twice as many readings as said first set of readings, and wherein said reference value comprises a function of a second selected reading, said second selected reading being selected from said second set of readings in the same fashion as said first selected reading is selected from said first set of readings.

4. The method of claim 3, wherein the value of said first selected reading comprises a median ($m_r$) of the values of said first set of readings and said second selected reading comprises a median ($m_{ref}$) of the values of said second set of readings.

5. The method of claim 4, wherein said function comprises a linear function $f(m_{ref})=am_{ref}$, wherein 'a' is a predefined factor that corresponds with said predefined probability at a predefined statistical confidence level.

6. The method of claim 1, further comprising sorting said first set of readings according to an indirect insertion sorting technique.

7. The method of claim 6, wherein said signal comprises a voltage signal corresponding to a voltage difference across said dielectric layer, and said first set of readings comprises absolute values of changes in measurements of an amount of current flowing through said dielectric layer as a consequence of said voltage signal, wherein said changes are each calculated as the difference between subsequent current measurements.

8. The method of claim 6, wherein said signal comprises a current signal corresponding to a current flowing through said dielectric layer, and said first set of readings comprises absolute values of changes in measurements of the voltage across said dielectric layer as a consequence of said current signal, wherein said changes are each calculated as the difference between two subsequent voltage measurements.

9. An apparatus for detecting breakdown in a dielectric layer of a single electronic devices, said apparatus comprising:

a means for applying a test signal to said dielectric layer;

a means for measuring one or gore sets of readings corresponding to the test signal;

a means for searching and identifying outlier readings selecting at least one selected reading from the one or more sets;

a means for comparing a value of said at least one selected reading to a reference value; and an output means for indicating, with a given probability, that a breakdown state is present in said dielectric layer on the basis of said comparison.

10. The apparatus of claim 9, wherein said means for calculating comprises a means for sorting said one or more sets of readings according to an indirect insertion sorting technique.

11. The apparatus of claim 10, wherein said test signal comprises a voltage signal corresponding to a voltage difference across said dielectric layer, and said readings comprise absolute values of current changes.

12. The apparatus of claim 10, wherein said test signal comprises a current signal corresponding to a current through said dielectric layer, and said readings comprise absolute values of voltage changes.

* * * * *

UNITED STATES PATENT AND TRADEMARK OFFICE
CERTIFICATE OF CORRECTION

PATENT NO. : 6,777,972 B2 Page 1 of 1
DATED : August 17, 2004
INVENTOR(S) : Roussel et al.

It is certified that error appears in the above-identified patent and that said Letters Patent is hereby corrected as shown below:

Column 14,
Line 36, please correct to read -- and selecting at least on selected reading from the one or --

Signed and Sealed this

Third Day of May, 2005

JON W. DUDAS
*Director of the United States Patent and Trademark Office*